(12) United States Patent
Friedmann et al.

(10) Patent No.: US 7,990,298 B1
(45) Date of Patent: Aug. 2, 2011

(54) REDUCTION OF DIGITAL-TO-ANALOG CONVERTER DISTORTION USING CONSTELLATION ROTATION

(75) Inventors: Jonathan Friedmann, Tel Aviv (IL); Rafi Ravid, Neve-Monosson (IL)

(73) Assignee: Provigent Ltd., Herzliya (IL)

( * ) Notice: Subject to any disclaimer, the term of this patent is extended or adjusted under 35 U.S.C. 154(b) by 0 days.

(21) Appl. No.: 12/726,378

(22) Filed: Mar. 18, 2010

(51) Int. Cl.
*H03M 1/06* (2006.01)

(52) U.S. Cl. ........................................ 341/118; 375/260

(58) Field of Classification Search .......... 341/118–155; 375/260, 332, 350, 316, 267, 299, 247, 283, 375/142, 274
See application file for complete search history.

(56) References Cited

U.S. PATENT DOCUMENTS

| | | | |
|---|---|---|---|
| 6,393,083 B1 * | 5/2002 | Beukema | 375/371 |
| 7,098,828 B2 * | 8/2006 | San et al. | 341/143 |
| 7,227,482 B2 * | 6/2007 | San et al. | 341/143 |
| 7,620,113 B2 * | 11/2009 | Inagawa | 375/260 |

* cited by examiner

*Primary Examiner* — Lam T Mai
(74) *Attorney, Agent, or Firm* — D. Kligler I.P. Services Ltd

(57) ABSTRACT

A method for signal conversion includes generating a complex digital signal, which includes digital In-phase (I) and Quadrature (Q) components, for conversion into respective analog I and Q components by first and second Digital-to-Analog Converters (DACs). A distortion generated by the DACS in the analog I and Q components is reduced by applying a phase rotation to the complex digital signal. After applying the phase rotation, the digital I and Q components of the complex digital signal are converted into the respective analog I and Q components using the first and second DACs.

27 Claims, 3 Drawing Sheets

REDUCTION OF DIGITAL-TO-ANALOG CONVERTER DISTORTION USING CONSTELLATION ROTATION

FIELD OF THE INVENTION

The present invention relates generally to signal conversion, and particularly to methods and systems for reducing the Peak-to-Average Ratio (PAR) of signals processed by Digital-to-Analog Converters (DACs).

BACKGROUND OF THE INVENTION

Some signal conversion systems use In-phase/Quadrature (I/Q) configurations, in which a complex digital signal is represented by orthogonal I and Q components. In some I/Q configurations, a complex digital signal is converted into an analog signal using a pair of Digital-to-Analog Converters (DACs), one for converting the I component and the other for converting the Q component. Such configurations are used, for example, in communication transmitters.

Some transmitters pre-distort the complex digital signal before digital-to-analog conversion, e.g., in order to compensate for non-linear distortion caused by the transmitter Power Amplifier (PA).

SUMMARY OF THE INVENTION

An embodiment of the present invention provides a method for signal conversion, including:

generating a complex digital signal, which includes digital In-phase (I) and Quadrature (Q) components, for conversion into respective analog I and Q components by first and second Digital-to-Analog Converters (DACs);

reducing a distortion generated by the DACS in the analog I and Q components by applying a phase rotation to the complex digital signal; and after applying the phase rotation, converting the digital I and Q components of the complex digital signal into the respective analog I and Q components using the first and second DACs.

In some embodiments, reducing the distortion includes identifying the phase rotation that reduces the distortion generated by the DACS, and applying the identified phase to the complex digital signal prior to conversion by the DACs. In an embodiment, the analog I and Q components have respective first and second Peak-to-Average Ratios (PARs), and the applied phase rotation reduces at least one of the PARs. In a disclosed embodiment, the method includes measuring the first and second PARs, and computing the phase rotation based on the measured PARs. In some embodiments, the applied phase rotation reduces a probability that at least one of the analog I and Q components exceeds a given amplitude.

In an embodiment, the method includes applying to the complex digital signal a pre-distortion operation prior to conversion by the DACs, and the applied phase rotation depends on a characteristic of the pre-distortion operation. In a disclosed embodiment, applying the pre-distortion operation includes filtering the complex digital signal with one or more coefficients, and the applied phase rotation depends on the coefficients. In another embodiment, the pre-distortion operation compensates for a response of a Power Amplifier (PA) that amplifies a Radio Frequency (RF) signal derived from the analog I and Q components, and the applied phase rotation is selected so as to match the response. In an embodiment, the applied phase rotation depends on a temperature of the PA. In another embodiment, the PA belongs to a set of PAs, and selecting the phase rotation includes choosing a common phase rotation for the set.

In yet another embodiment, applying the phase rotation includes modifying the phase rotation over time. In still another embodiment, the applied phase rotation reduces the distortion and further meets an additional criterion defined with respect to the analog I and Q components. In a disclosed embodiment, the method includes generating a Radio Frequency (RF) signal from the analog I and Q components, and transmitting the RF signal to a receiver.

There is additionally provided, in accordance with an embodiment of the present invention, apparatus for signal conversion, including:

first and second Digital-to-Analog Converters (DACs), which are configured to convert digital In-phase (I) and Quadrature (Q) components of a complex digital signal into analog I and Q components, respectively; and a phase rotator, which is configured to reduce a distortion generated by the DACS in the analog I and Q components by applying a phase rotation to the complex digital signal prior to conversion by the DACs.

In an embodiment, the apparatus includes a mapper that generates the complex digital signal and includes the phase rotator.

The present invention will be more fully understood from the following detailed description of the embodiments thereof, taken together with the drawings in which:

DETAILED DESCRIPTION OF EMBODIMENTS

Overview

When a Digital-to-Analog Converter (DAC) converts a digital signal into an analog signal, undesired distortion products are often generated in the analog signal. The distortion is generally non-linear, and its level usually grows with the Peak-to-Average Ratio (PAR) of the converted digital signal. Many systems, such as communication transmitters, perform digital-to-analog conversion of a complex digital signal that is represented by an In-phase (I) component and a Quadrature (Q) component. The complex digital signal is converted into an analog signal by a pair of DACs, each DAC converting one of the I and Q components. The level of distortion at the output of each DAC typically depends on the PAR of the respective digital signal component converted by the DAC.

Embodiments of the present invention that are described hereinbelow provide improved methods and systems for converting complex digital signals into analog signals. The disclosed methods and systems identify a certain phase rotation which, when applied to the complex digital signal before conversion, minimizes (or at least reduces) the PARs of the digital I and Q components at the DAC inputs. The identified phase rotation is applied to the complex digital signal, and the digital I and Q components of the rotated signal are converted into respective analog components by the two DACs. Since each DAC processes a signal component having a reduced PAR, the distortion level at the DAC output (and therefore in the resulting analog signal) is reduced. In most applications, applying a constant or slowly-varying phase rotation to the signal is tolerable and does not affect system performance, since a receiver of the signal can readily compensate for the phase rotation.

In one embodiment, the disclosed technique is applied in a communication transmitter. The transmitter comprises a Power Amplifier (PA), which causes non-linear distortion of the transmitted signal. In order to compensate for the PA distortion, the transmitter pre-distorts the complex digital signal. The pre-distortion operation increases the PARs of the digital I and Q components of the complex digital signal, and affects the optimal phase rotation that should be applied to them. In this embodiment, the transmitter determines the desired phase rotation based on a characteristic of the pre-distortion operation.

The disclosed techniques enable conversion of high-PAR digital signals into analog signals with low distortion. These techniques are especially suitable for communication transmitters that transmit modulated digital signals, but they can also be used in various other signal conversion applications.

System Description

Figure 1:
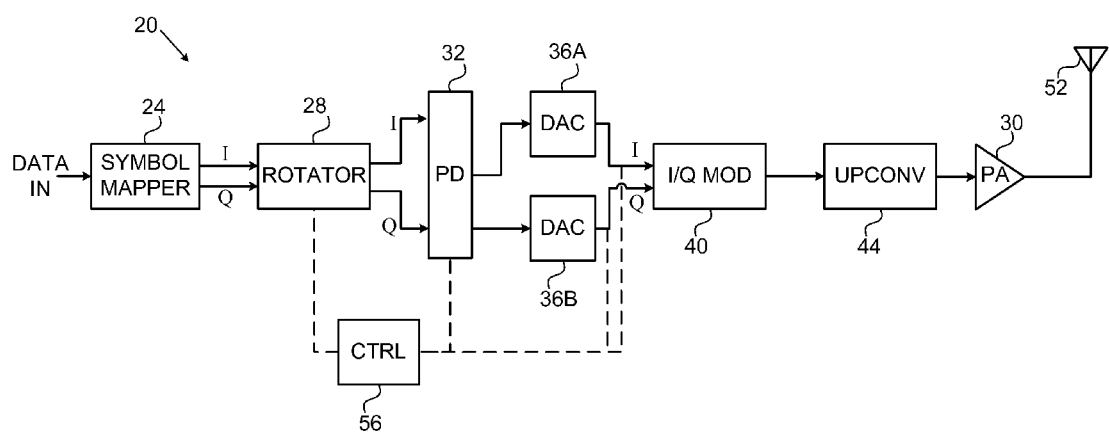
FIG. 1 is a block diagram that schematically illustrates a communication transmitter, in accordance with an embodiment of the present invention.

FIG. 1 is a block diagram that schematically illustrates a communication transmitter 20, in accordance with an embodiment of the present invention. Transmitter may be part of any suitable digital communication system, such as a point-to-point microwave or millimeter-wave communication link, a cellular communication system or a satellite communication system. Although the embodiments described herein refer mainly to wireless transmitters, the disclosed techniques can also be used in wire-line transmitters that transmit Radio-Frequency (RF) signals, such as in cable communication systems. Moreover, the methods and systems described herein are not limited to transmitters, and can be used in any other system that converts complex digital signals into analog signals.

Transmitter 20 comprises a symbol mapper 24, which accepts data for transmission and converts the data into a sequence of complex modulated symbols in the In-phase/Quadrature (I/Q) plane. Typically, mapper 24 maps every m data bits (m≧1) to a symbol selected from a predefined constellation of $2^m$ constellation symbols. Mapper 24 may use any suitable constellation of any suitable modulation scheme, such as Quaternary Phase Shift Keying (QPSK), eight-symbol Phase Shift Keying (8-PSK), Sixteen-symbol Quadrature Amplitude Modulation (16-QAM), 32-QAM, 64-QAM, 256-QAM or any other suitable scheme.

The output of mapper 24 thus comprises a sequence of I samples and a sequence of Q samples. Each pair of corresponding I and Q samples represents a modulated symbol. In other words, mapper 24 generates a complex digital signal, which comprises a digital I component (the sequence of I samples) and a digital Q component (the sequence of Q samples).

A phase rotator 28 rotates the complex digital signal by a certain phase. The phase rotation is computed so as to reduce the level of distortion at the transmitter output, using methods that are described in detail below. Rotator 28 may rotate the complex digital signal, for example, by multiplying the digital I and Q components digitally by coefficients of a rotation matrix, or using any other suitable technique. Rotator 28 outputs a sequence of I samples and a sequence of Q samples, representing the rotated complex digital signal.

Transmitter 20 pre-distorts the rotated complex digital signal, in order to compensate for non-linear distortion caused by a Power Amplifier (PA) 30 that amplifies the signal before transmission. In the example of FIG. 1, transmitter 20 comprises a Pre-Distortion (PD) module 32 that pre-distorts the digital I and Q components of the signal.

After performing pre-distortion, the transmitter converts the pre-distorted complex digital signal into an analog signal. In the present example, transmitter 20 comprises a Digital-to-Analog Converter (DAC) 36A that converts the digital I component into an analog I component, and another DAC 36B that converts the digital Q component into an analog Q component. The analog I and Q components produced by the DACs typically comprise baseband signals. Typically, the DACs generate some distortion products that distort the analog I and Q components. The phase rotation applied by rotator 28 attempts to reduce the level of these distortion products, as will be described below.

An I/Q modulator 40 combines the analog I and Q components in quadrature, so as to produce an Intermediate Frequency (IF) signal. An up-converter 44 up-converts the IF signal so as to produces a Radio Frequency (RF) signal. The RF signal is amplified by PA 30, and then transmitted to a receiver (not shown) via an antenna 52.

A control unit 56 manages the operation of transmitter 20 and controls the different transmitter components. In particular, control unit 56 calculates the phase rotation to be applied by rotator 28, and configures rotator 28 to apply this phase rotation. The control unit may calculate the optimal phase rotation based on various inputs, such as characteristics of the analog I and Q components at the DAC outputs, characteristics of the pre-distortion operation applied by PD module 32, and/or predetermined values (e.g., known PA properties and thus known predistortion coefficients).

The transmitter configuration shown in FIG. 1 is an example configuration, which is chosen purely for the sake of conceptual clarity. In alternative embodiments, any other suitable transmitter configuration can be used. For example, the function of phase rotator 28 can be embodied in mapper 24. Alternatively, the phase rotation functionality may be carried out at any other suitable stage of the transmitter, such as between the PD module and the DACs. Further alternatively, the phase rotation can be implemented as part of PD module 32.

The digital elements of transmitter 20, such as the symbol mapper, rotator, PD modules, control unit and possibly the DACs, may be implemented using digital or mixed-signal hardware, e.g., in one or more Application-Specific Integrated Circuits (ASICs) or Field-Programmable Gate Arrays (FPGAs). The analog elements of transmitter 20, such as the I/Q modulator, up-converter and possibly the DACS, may be implemented in a RF Integrated Circuit (RFIC) and/or using discrete components. Some transmitter functions, such as some or all of the functions of control unit 56, may be implemented in software executing on a suitable processor.

Reducing DAC Distortion Using Constellation Rotation

When DACs 36A and 36B convert the digital I and Q components into the respective analog I and Q components, they generate distortion products in the analog components. The distortion may be caused, for example, by various non-linear effects in the DAC circuitry. In many practical cases, the level of the distortion grows with the Peak-to-Average Ratio (PAR) of the digital signal that is converted by the DAC.

The PAR of a signal is typically defined as the ratio between the maximal signal power and the average signal power. In some cases, the maximal signal power is defined as the power that is exceeded for less than a certain percentage of the time (e.g., the power exceeded for less than $10^{-5}$ of the time). The PAR may alternatively be defined as the ratio between the maximal and average signal amplitudes. Typically, the PAR is expressed on a logarithmic scale, in dB. Although the description herein refers mainly to PAR, an alternative figure-of-merit is the probability that the signal amplitude is X dB above its average value. This probability can be determined, for example, by observing the Complementary Cumulative Distribution Function (CCDF) of a signal.

As noted above, transmitter 20 rotates the phase of the complex digital signal so as to reduce the PARs of the individual digital I and Q components. In many modulation schemes (e.g., QPSK and various QAM schemes), the PAR of the digital I and Q components is already minimal without additional phase rotation. Additional processing in the transmitter, however, may distort the symbol constellation such that some phase rotation will yield smaller PARs. In particular, the pre-distortion operation applied by PD module 32 may modify the phase and/or amplitude of the constellation symbols. Rotating the pre-distorted constellation by a certain phase may reduce the PARs of the individual digital I and Q components.

Figure 2:
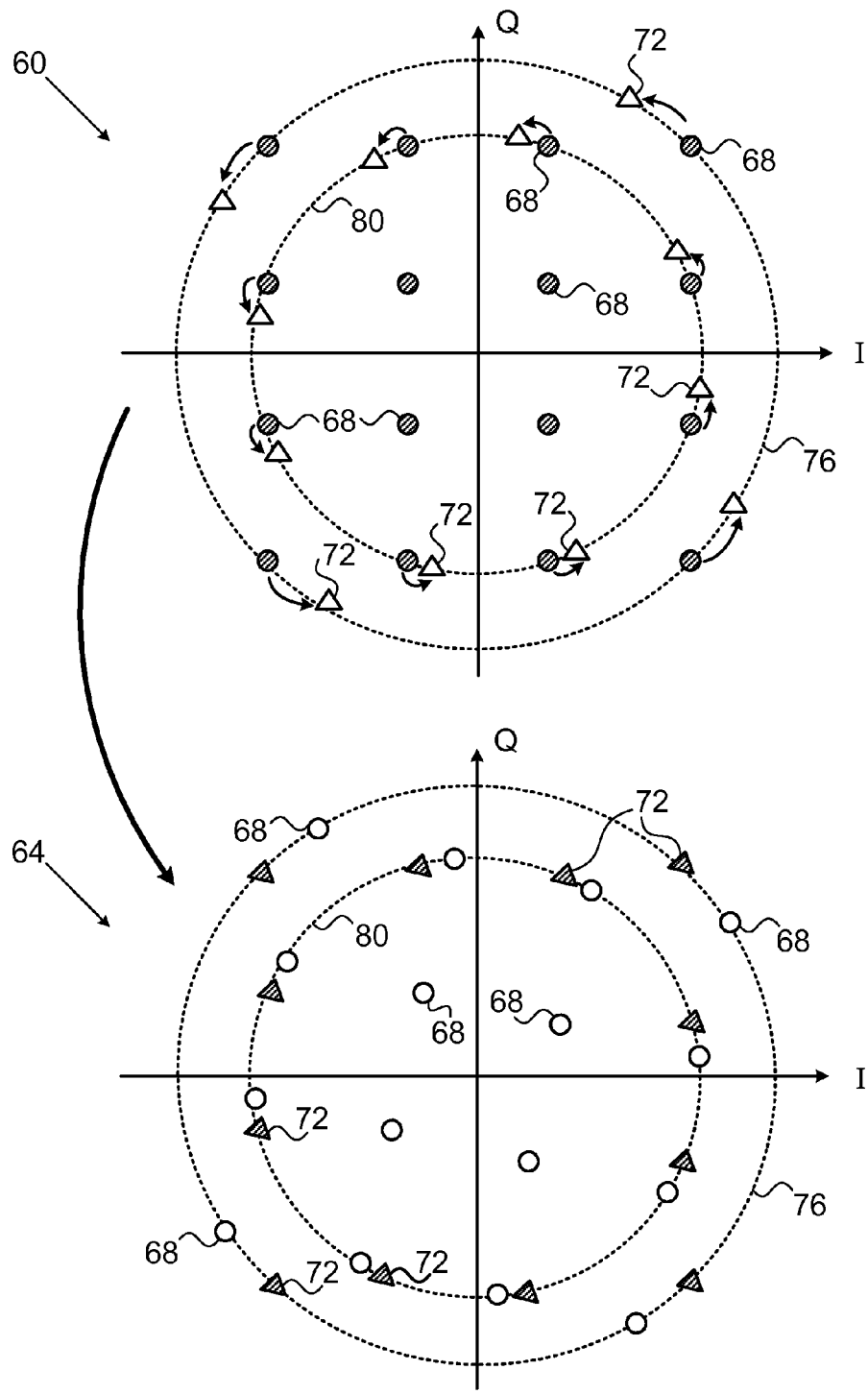
FIG. 2 is a signal-space diagram showing a complex digital signal before and after constellation rotation, in accordance with an embodiment of the present invention.

FIG. 2 shows I/Q signal-space diagrams of a complex digital signal before and after phase rotation, in accordance with an embodiment of the present invention. The present example refers to a 16-QAM constellation having sixteen constellation symbols. A signal-space diagram 60 shows the 16-QAM constellation symbols before applying phase rotation by rotator 28. A signal-space diagram 64 shows the 16-QAM constellation symbols after applying phase rotation.

In diagram 60, signal points 68 show the signal-space (I/Q) coordinates of the 16-QAM constellation symbols as they are produced by symbol mapper 24. Points are referred to as original constellation symbols. Signal points 72 show the signal-space coordinates of the constellation symbols after they have been pre-distorted by PD module 32. Points 72 are referred to as pre-distorted constellation symbols. An arrow connects each original constellation symbol 68 to the respective pre-distorted constellation symbol 72, in order to illustrate the pre-distortion operation.

In the present example, PA 30 is assumed to apply negative (clockwise) phase shifts to the constellation symbols. The phase shift is largest for the high-magnitude constellation symbols (the symbols that lie on an outer circle 76), and smaller for the mid-magnitude constellation symbols (the symbols that lie on a circle 80). The four lowest-magnitude constellation symbols are assumed to be unaffected by the PA. In order to compensate for this PA distortion, PD module 32 applies positive (counterclockwise) phase shifts to the constellation symbols. As can be seen in the figure, the PD module applies a relatively large positive phase shift to the constellation symbols that lie on circle 76, and a smaller positive phase shift to the constellation symbols that lie on circle 80. The four innermost constellation symbols are not affected by the pre-distortion operation.

Before pre-distortion, The PARs of the digital I and Q components (the projections of signal points 68 onto the I and Q axes) are minimal without additional phase rotation. The pre-distortion operation, however, increases the PARs of the digital I and Q components (the projections of signal points 72 onto the I and Q axes). Thus, the phase of the pre-distorted constellation (signal points 72) with respect to the I and Q axes no longer minimizes the PARs of the individual I and Q components.

Signal-space diagram 64 shows the 16-QAM constellation symbols after applying the optimal phase rotation by rotator 28. In diagram 64, both the original constellation (signal points 68) and the pre-distorted constellation (signal points 72) are phase-shifted by approximately $-15°$. As can be seen by examining signal points 72 in diagram 64, this phase rotation minimizes the PARs of the digital I and Q components of the pre-distorted constellation (the projections of signal points 72 in diagram 64 onto the I and Q axes). These I and Q components (the projections of signal points 72 in diagram 64 onto the I and Q axes) are the ones provided to DACs 36A and 36B for conversion. Since the PARs of these components are minimized, the distortion generated by the DACs will also be minimal.

In the example of FIG. 2, the PA is assumed to cause only phase distortion (also referred to as AM-to-PM), and not amplitude distortion (referred to as AM-to-AM). In order to compensate for this distortion, PD module 32 modifies only the phases and not the amplitudes of the constellation symbols. Generally, however, the methods and systems described herein can be used with AM-to-PM and/or AM-to-AM distortion types. For any given pre-distortion characteristic, there exists a phase rotation that minimizes the PARs of the I and Q components of the pre-distorted signal. Rotating the complex digital signal by that phase will minimize the distortion generated by DACs 36A and 36B. Although the example of FIG. 2 refers to a 16-QAM constellation, the disclosed techniques can be used with any other suitable constellation.

Figure 3:
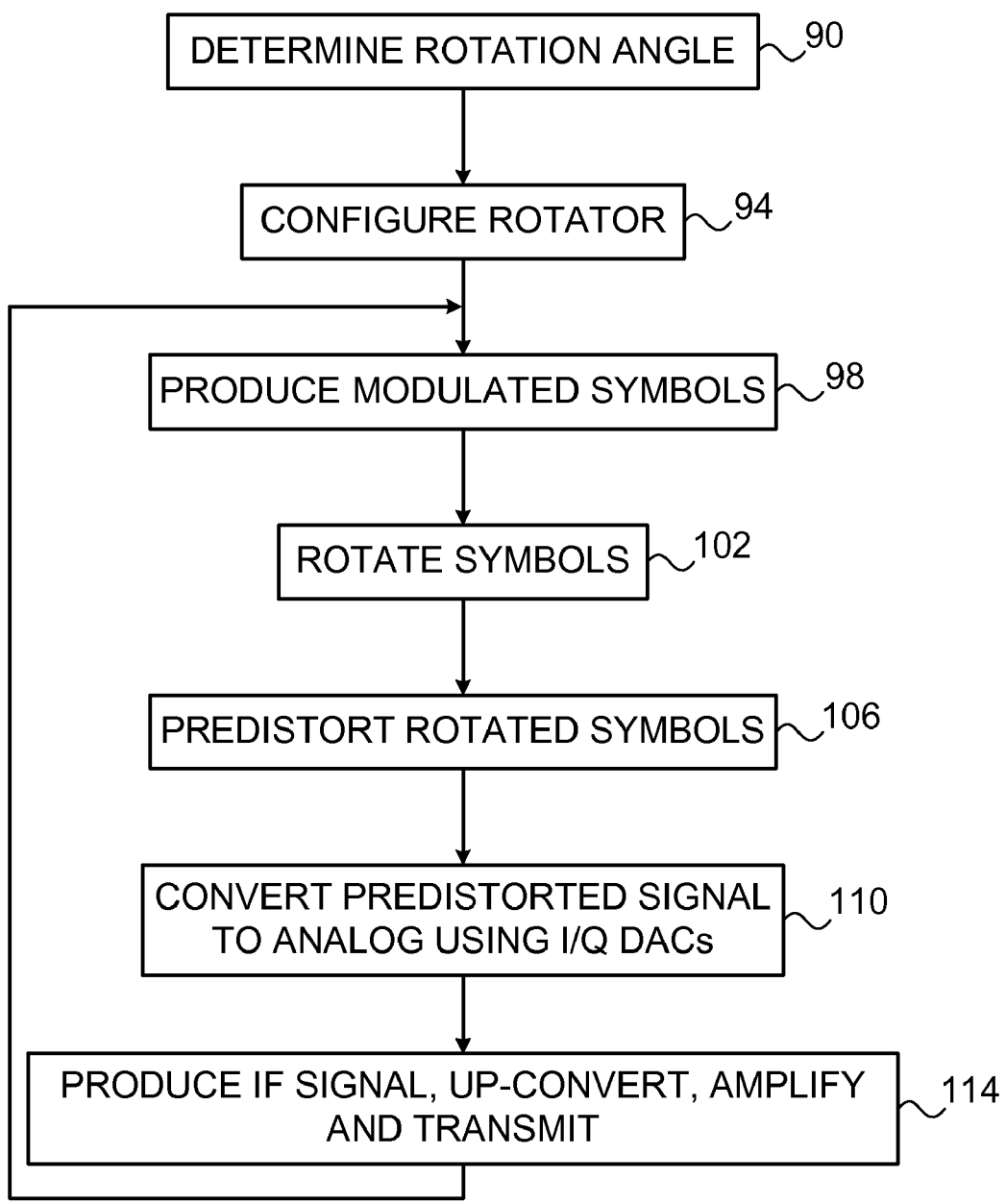
FIG. 3 is a flow chart that schematically illustrates a method for reducing Digital-to-Analog Converter (DAC) distortion using constellation rotation, in accordance with an embodiment of the present invention.

FIG. 3 is a flow chart that schematically illustrates a method for reducing DAC distortion using constellation rotation, in accordance with an embodiment of the present invention. The method begins with control unit 56 in transmitter 20 determining the optimal phase rotation, which minimizes the PARs of the digital I and Q components of the complex digital signal provided to DACs 36A and 36B, at a phase calculation step 90. Control unit 56 configures rotator 28 to apply this phase rotation, at a rotator configuration step 94.

Symbol mapper 24 generates a complex digital signal comprising a sequence of modulated symbols for transmission, at a symbol generation step 98. Rotator 28 rotates the complex digital signal by the appropriate phase rotation determined at step 90 above, at a rotation step 102. PD module 32 pre-distorts the rotated complex digital signal, at a pre-distortion step 106. DACs 36A and 36B convert the I and Q components of the pre-distorted complex digital signal into respective analog I and Q components, at a conversion step 110. Since the phase rotation applied by rotator 28 minimizes the PARs of the I and Q components of the pre-distorted complex digital signal, the distortion produced by the DACs is minimized.

Transmitter 20 then processes and transmits the signal, at a transmission step 114. The transmitter combines the DAC outputs in quadrature using I/Q modulator 40 to produce an IF signal, up-converts the IF signal to RF using up-converter 44, amplifies the RF signal using PA 30, and transmits the amplified signal via antenna 52 to the receiver.

Control unit 56 may determine the optimal phase rotation in any suitable way. For example, the control unit may measure the level of distortion at the outputs of DACs 56, and attempt to modify the phase rotation in order to reduce the distortion level. Alternatively, unit 56 may determine the optimal phase rotation based on a characteristic of the pre-distortion operation applied by PD module 32. For example, in some embodiments the PD modules pre-distort the signal by filtering it with a (typically non-linear) filter having one or more coefficients. In these embodiments, unit 56 may compute the optimal phase rotation as a function of the pre-distortion coefficients.

In some embodiments, unit 56 modifies the phase rotation over time in an adaptive manner, and controls rotator 28 accordingly. For example, PD module 32 may apply adaptive pre-distortion, i.e., modify the pre-distortion coefficients over time in order to track changes in the PA characteristics. For example, the phase rotation may vary depending on the temperature of the PA. Control unit 56 may modify the phase rotation applied by rotator 28 to best match the changing pre-distortion coefficients.

In alternative embodiments, the phase rotation applied by rotator 28 may be fixed. For example, the pre-distortion coefficients applied by the PD module may be fixed a-priori, and unit 56 may set the phase rotation of rotator 28 to match these fixed coefficients. The pre-phase rotation may be selected to match the response of each individual PA 30. Alternatively, a common phase rotation value can be selected for a given batch or type of PAs.

In some embodiments, the phase rotation applied by rotator 28 may be set based on additional criteria defined over the analog signal components, in addition to minimizing DAC distortion. For example, a Multiple-Input Multiple-Output (MIMO) transmitter may comprise two or more transmitters similar to transmitter 20, which transmit in parallel via multiple antennas 52. In an example MIMO configuration, the multiple transmitters transmit the same signal, and the relative phase between the transmitters is set so as to steer the transmission beam in the desired direction. Such a scheme is referred to as beam-forming or beam-steering. In these MIMO configurations, rotator 28 can be used to control the relative phase between transmitters, in addition to minimizing DAC distortion within the individual transmitter. Typically, the rotation of the beam-forming phase between transmitters is coordinated with the PAR-related phase rotations applied within the individual transmitters, so as to achieve the desired beam-forming phase and at the same time reduce the signal PAR in the transmitters.

Although the embodiments described herein refer mainly to phase rotation that compensates for the effects of signal pre-distortion, the disclosed techniques can be used to minimize the PARs of the I and Q components following any other suitable distortion of the constellation.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for signal conversion, comprising:
   generating a complex digital signal, which comprises digital In-phase (I) and Quadrature (Q) components, for conversion into respective analog I and Q components by first and second Digital-to-Analog Converters (DACs);
   reducing a distortion generated by the DACS in the analog I and Q components by applying a phase rotation to the complex digital signal; and
   after applying the phase rotation, converting the digital I and Q components of the complex digital signal into the respective analog I and Q components using the first and second DACs,
   wherein the analog I and Q components have respective first and second Peak-to-Average Ratios (PARs), and wherein the applied phase rotation reduces at least one of the PARs.

2. The method according to claim 1, wherein reducing the distortion comprises identifying the phase rotation that reduces the distortion generated by the DACS, and applying the identified phase to the complex digital signal prior to conversion by the DACs.

3. The method according to claim 1, and comprising measuring the first and second PARs, and computing the phase rotation based on the measured PARs.

4. The method according to claim 1, wherein the applied phase rotation reduces a probability that at least one of the analog I and Q components exceeds a given amplitude.

5. The method according to claim 1, and comprising applying to the complex digital signal a pre-distortion operation prior to conversion by the DACs, wherein the applied phase rotation depends on a characteristic of the pre-distortion operation.

6. The method according to claim 5, wherein applying the pre-distortion operation comprises filtering the complex digital signal with one or more coefficients, and wherein the applied phase rotation depends on the coefficients.

7. The method according to claim 5, wherein the pre-distortion operation compensates for a response of a Power Amplifier (PA) that amplifies a Radio Frequency (RF) signal derived from the analog I and Q components, and wherein the applied phase rotation is selected so as to match the response.

8. The method according to claim 7, wherein the applied phase rotation depends on a temperature of the PA.

9. The method according to claim 7, wherein the PA belongs to a set of PAs, and wherein selecting the phase rotation comprises choosing a common phase rotation for the set.

10. The method according to claim 1, wherein applying the phase rotation comprises modifying the phase rotation over time.

11. The method according to claim 1, wherein the applied phase rotation reduces the distortion and further meets an additional criterion defined with respect to the analog I and Q components.

12. The method according to claim 1, and comprising generating a Radio Frequency (RF) signal from the analog I and Q components, and transmitting the RF signal to a receiver.

13. Apparatus for signal conversion, comprising:
   first and second Digital-to-Analog Converters (DACs), which are configured to convert digital In-phase (I) and Quadrature (Q) components of a complex digital signal into analog I and Q components, respectively; and
   a phase rotator, which is configured to reduce a distortion generated by the DACS in the analog I and Q components by applying a phase rotation to the complex digital signal prior to conversion by the DACs,
   wherein the analog I and Q components have respective first and second Peak-to-Average Ratios (PARs), and wherein the applied phase rotation reduces at least one of the PARs.

14. The apparatus according to claim 13, and comprising a control unit, which is configured to identify the phase rotation which, when applied by the phase rotator, reduces the distortion generated by the DACs, and to cause the phase rotator to apply the identified phase rotation to the complex digital signal.

15. The apparatus according to claim 13, and comprising a control unit, which is configured to measure the first and second PARs, to compute the phase rotation based on the measured PARs, and to cause the phase rotator to apply the computed phase rotation to the complex digital signal.

16. The apparatus according to claim 13, wherein the applied phase rotation reduces a probability that at least one of the analog I and Q components exceeds a given amplitude.

17. The apparatus according to claim 13, and comprising a pre-distortion unit, which is configured to apply to the complex digital signal a pre-distortion operation prior to conversion by the DACs, wherein the applied phase rotation depends on a characteristic of the pre-distortion operation.

18. The apparatus according to claim 17, wherein the pre-distortion unit is configured to filter the complex digital signal with one or more coefficients, and wherein the applied phase rotation depends on the coefficients.

19. The apparatus according to claim 17, wherein the pre-distortion operation compensates for a response of a Power Amplifier (PA) that amplifies a Radio Frequency (RF) signal derived from the analog I and Q components, and wherein the applied phase rotation is selected so as to match the response.

20. The apparatus according to claim 19, wherein the applied phase rotation depends on a temperature of the PA.

21. The apparatus according to claim 19, wherein the PA belongs to a set of PAs, and wherein the applied phase rotation is selected in common for the set.

22. The apparatus according to claim 13, and comprising a control unit, which is configured to modify the applied phase rotation over time.

23. The apparatus according to claim 13, wherein the applied phase rotation reduces the distortion and further meets an additional criterion defined with respect to the analog I and Q components.

24. The apparatus according to claim 13, and comprising transmission circuitry, which is configured to generate a Radio Frequency (RF) signal from the analog I and Q components, and to transmit the RF signal to a receiver.

25. The apparatus according to claim 13, and comprising a mapper, which generates the complex digital signal and comprises the phase rotator.

26. A method for signal conversion, comprising:
generating a complex digital signal, which comprises digital In-phase (I) and Quadrature (Q) components, for conversion into respective analog I and Q components by first and second Digital-to-Analog Converters (DACs);
reducing a distortion generated by the DACS in the analog I and Q components by applying a phase rotation to the complex digital signal; and
after applying the phase rotation, converting the digital I and Q components of the complex digital signal into the respective analog I and Q components using the first and second DACs,
wherein reducing the distortion comprises identifying the phase rotation that reduces the distortion generated by the DACS, and applying the identified phase to the complex digital signal prior to conversion by the DACs.

27. Apparatus for signal conversion, comprising:
first and second Digital-to-Analog Converters (DACs), which are configured to convert digital In-phase (I) and Quadrature (Q) components of a complex digital signal into analog I and Q components, respectively;
a phase rotator, which is configured to reduce a distortion generated by the DACS in the analog I and Q components by applying a phase rotation to the complex digital signal prior to conversion by the DACs; and
a control unit, which is configured to identify the phase rotation which, when applied by the phase rotator, reduces the distortion generated by the DACs, and to cause the phase rotator to apply the identified phase rotation to the complex digital signal.

* * * * *